(12) United States Patent
Miller et al.

(10) Patent No.: US 11,916,515 B2
(45) Date of Patent: Feb. 27, 2024

(54) DEMODULATION OF NON-RETURN TO ZERO (NRZ) OR OTHER SIGNALS USING MULTIPLE-INPUT ARTIFICIAL INTELLIGENCE/MACHINE LEARNING (AI/ML) MODEL

(71) Applicant: Raytheon Company, Waltham, MA (US)

(72) Inventors: Jacob M. Miller, State College, PA (US); H. Brown Cribbs, III, Arlington, VA (US)

(73) Assignee: Raytheon Company, Tewksbury, MA (US)

(*) Notice: Subject to any disclaimer, the term of this patent is extended or adjusted under 35 U.S.C. 154(b) by 201 days.

(21) Appl. No.: 17/670,814

(22) Filed: Feb. 14, 2022

(65) Prior Publication Data

US 2023/0261613 A1    Aug. 17, 2023

(51) Int. Cl.
  *H03D 9/00*   (2006.01)
  *G06N 3/04*   (2023.01)
  *G06N 20/00*  (2019.01)
  *H04L 27/26*  (2006.01)

(52) U.S. Cl.
  CPC ............. *H03D 9/00* (2013.01); *G06N 3/04* (2013.01); *G06N 20/00* (2019.01); *H04L 27/2649* (2013.01)

(58) Field of Classification Search
  CPC ........................................................ H03D 9/00
  USPC ........................................................ 329/304
  See application file for complete search history.

(56) References Cited

U.S. PATENT DOCUMENTS

| 2,292,387 | A   | 8/1942  | Markey et al. |
| 7,835,319 | B2  | 11/2010 | Sugar |
| 7,920,637 | B2  | 4/2011  | Fonseka et al. |
| 2018/0014217 | A1 | 1/2018 | Kleinbeck et al. |
| 2023/0144796 | A1* | 5/2023 | DePoy ............... G06N 3/09 |
|  |  |  | 706/12 |

FOREIGN PATENT DOCUMENTS

| CN | 109617845 A | 4/2019 |
| CN | 110113288 A | 8/2019 |

OTHER PUBLICATIONS

Wang et al., "Deep Learning for Signal Demodulation in Physical Layer Wireless Communications: Prototype Platform, Open Dataset, and Analytics," arXiv: 1903.04297v1 [eess.SP], Mar. 2019, 8 pages.
Khalfi et al., "When Machine Learning Meets Compressive Sampling for Wideband Spectrum Sensing," IEEE, 2017, 6 pages.

(Continued)

*Primary Examiner* — Joseph Chang

(57) ABSTRACT

A method includes obtaining pairs of in-phase (I) and quadrature (Q) samples associated with a signal to be demodulated. The method also includes providing a set of the I/Q pairs to a trained AI/ML model. The set of the I/Q pairs includes an I/Q pair associated with a symbol being demodulated and at least one I/Q pair associated with at least one prior symbol that has been demodulated. In addition, the method includes using the trained AI/ML model to generate a symbol estimate for the symbol based on the set of the I/Q pairs, where the symbol estimate represents a portion of data that is encoded in the signal.

20 Claims, 3 Drawing Sheets

(56) References Cited

OTHER PUBLICATIONS

O'Shea et al., "Learning Robust General Radio Signal Detection using Computer Vision Methods," IEEE, 2017, 4 pages.
Shevitski et al., "Digital Signal Processing Using Deep Neural Networks," arXiv:2109.10404 [eess.SP], Sep. 2021, 21 pages.
Ma et al., "Signal Demodulation with Machine Learning Methods for Physical Layer Visible Light Communications: Prototype Platform, Open Dataset and Algorithms," arXiv:1903.11385v1 [eess.SP], Mar. 2019, 10 pages.
Roy et al., "Detection of Rogue RF Transmitters using Generative Adversarial Nets," 2019 IEEE Wireless Communications and Networking Conference (WCNC), 2019, 7 pages.
Wei et al., "Blind Estimation of the PN Sequence of A DSSS Signal Using A Modified Online Unsupervised Learning Machine," MDPI Article, Sensors, 2019, 12 pages.
Davies, "Radio Frequency Machine Learning Systems (RFMLS)," Defense Advanced Research Projects Agency, May 2020, 2 pages.
"The Radio Frequency Spectrum + Machine Learning = A New Wave in Radio Technology," Defense Advanced Research Projects Agency, Aug. 2017, 4 pages.
Kozoil et al., "Interception of Frequency-hopped DPSK Signals Using Unsynchronized Detection and Pattern Recognition," ResearchGate, Oct. 2004, 8 pages.
Wang et al., "Compressive Sampling for Recognition of Frequency-Hopping Spread Spectrum Signals," 12th International Conference on Wireless Communications and Signal Processing, IEEE, 2020, 6 pages.
Liu et al., "An EM Algorithm for Blind Hop Timing Estimation of Multiple FH Signals Using an Array System With Bandwidth Mismatch," IEEE Transactions on Vehicular Technology, vol. 56, No. 5, Sep. 2007, 10 pages.
Miller et al., "Demodulation of Frequency-Hopping Spread Spectrum (FHSS) Signals Using Sequential Artificial Intelligence/ Machine Learning (AI/ML) Models," U.S. Appl. No. 17/550,713, filed Dec. 14, 2021, 35 pages.

\* cited by examiner

DEMODULATION OF NON-RETURN TO ZERO (NRZ) OR OTHER SIGNALS USING MULTIPLE-INPUT ARTIFICIAL INTELLIGENCE/MACHINE LEARNING (AI/ML) MODEL

TECHNICAL FIELD

This disclosure relates generally to signal analysis systems. More specifically, this disclosure relates to the demodulation of non-return to zero (NRZ) or other signals using a multiple-input artificial intelligence/machine learning (AI/ML) model.

BACKGROUND

Signal intelligence (SIGINT) generally refers to intelligence-gathering operations that occur through the interception and processing of electromagnetic signals or other signals. Ideally, intercepted signals can be demodulated, and data can be recovered from the demodulated signals. The recovered data may then be used for any suitable purposes. Similar types of operations may occur in a number of other signal analysis applications.

SUMMARY

This disclosure relates to the demodulation of non-return to zero (NRZ) or other signals using a multiple-input artificial intelligence/machine learning (AI/ML) model.

In a first embodiment, a method includes obtaining pairs of in-phase (I) and quadrature (Q) samples associated with a signal to be demodulated. The method also includes providing a set of the I/Q pairs to a trained AI/ML model. The set of the I/Q pairs includes an I/Q pair associated with a symbol being demodulated and at least one I/Q pair associated with at least one prior symbol that has been demodulated. In addition, the method includes using the trained AI/ML model to generate a symbol estimate for the symbol based on the set of the I/Q pairs, where the symbol estimate represents a portion of data that is encoded in the signal.

In a second embodiment, an apparatus includes at least one processing device configured to obtain pairs of I and Q samples associated with a signal to be demodulated. The at least one processing device is also configured to provide a set of the I/Q pairs to a trained AI/ML model. The set of the I/Q pairs includes an I/Q pair associated with a symbol being demodulated and at least one I/Q pair associated with at least one prior symbol that has been demodulated. The at least one processing device is further configured to use the trained AI/ML model to generate a symbol estimate for the symbol based on the set of the I/Q pairs, where the symbol estimate represents a portion of data that is encoded in the signal.

In a third embodiment, a non-transitory computer readable medium contains instructions that when executed cause at least one processor to obtain pairs of I and Q samples associated with a signal to be demodulated. The medium also contains instructions that when executed cause the at least one processor to provide a set of the I/Q pairs to a trained AI/ML model. The set of the I/Q pairs includes an I/Q pair associated with a symbol being demodulated and at least one I/Q pair associated with at least one prior symbol that has been demodulated. The medium further contains instructions that when executed cause the at least one processor to use the trained AI/ML model to generate a symbol estimate for the symbol based on the set of the I/Q pairs, where the symbol estimate represents a portion of data that is encoded in the signal.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

Figure 1:
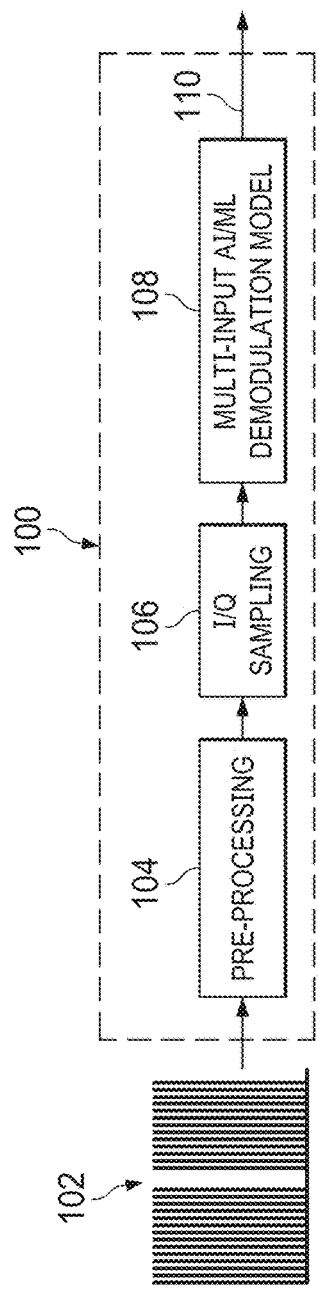
FIG. 1 illustrates an example architecture supporting demodulation of non-return to zero (NRZ) or other signals using a multiple-input artificial intelligence/machine learning (AI/ML) model according to this disclosure.

FIGS. 1 through 4, described below, and the various embodiments used to describe the principles of the present disclosure are by way of illustration only and should not be construed in any way to limit the scope of this disclosure. Those skilled in the art will understand that the principles of the present disclosure may be implemented in any type of suitably arranged device or system.

As noted above, signal intelligence (SIGINT) generally refers to intelligence-gathering operations that occur through the interception and processing of electromagnetic signals or other signals. Ideally, intercepted signals can be demodulated, and data can be recovered from the demodulated signals. The recovered data may then be used for any suitable purposes. Similar types of operations may occur in a number of other signal analysis applications.

A typical cognitive demodulator may use a feed-forward neural network that processes individual pairs of in-phase (I) and quadrature (Q) samples of an input signal in order to recover a symbol for each I/Q pair. While this may be effective for some types of modulation schemes, other modulation schemes may require knowledge of prior symbols when decoding subsequent symbols. For example, minimum shift keying (MSK) signals or other signals encoded using a non-return to zero (NRZ) protocol typically require knowledge of one or more previous symbols in order to determine a current symbol. As a result, approaches that use a feed-forward neural network to process individual pairs of I and Q samples cannot accurately demodulate MSK or other signals in which knowledge of prior symbols is needed.

This disclosure provides an approach for demodulating NRZ or other signals using a multiple-input artificial intelligence/machine learning (AI/ML) model. As described in more detail below, the AI/ML model may include an input layer, multiple hidden layers, and an output layer. These layers can be used to process an input set of multiple I/Q pairs, where the multiple I/Q pairs include an I/Q pair for a current symbol being demodulated and one or more I/Q pairs for one or more previous symbols that have already been demodulated. The I/Q pairs can be arranged in causal or time-based order in order to preserve the time history of the I/Q pairs. The input layer provides the I/Q pairs to a first of the hidden layers. The first hidden layer operates on the I/Q pairs, and results from the first hidden layer are provided to a second of the hidden layers. The second hidden layer processes the results from the first hidden layer to produce additional results, which are provided to the output layer. The output layer uses the additional results from the second hidden layer to produce an output symbol prediction, which represents the current symbol predicted to be contained in the input signal by the AI/ML model. The I/Q pairs in the input set can be shifted (dropping the oldest I/Q pair), a new I/Q pair can be added to the input set, and the input set can be used again to identify another output symbol prediction. This process can be repeated any number of times to recover any number of symbols representing data encoded in the input signal.

In some embodiments, the AI/ML model used here represents a "shallow" network, which generally uses two hidden layers to demodulate an incoming signal. In some cases, the AI/ML model is implemented using an artificial neural network (ANN). Also, in some cases, the first and second hidden layers may each have a size of 2(N+1), where N represents the number of I and Q inputs contained in an input set processed by the AI/ML model. Further, in some cases, the first and second hidden layers may support the use of hyperbolic tangent activation functions. In addition, in some cases, the outputs generated using the AI/ML model may represent "one-hot" vectors denoting the symbols being recovered. Symbols subsequently can be converted into digital bit values that are further processed or used in some manner.

In this way, this AI/ML-based approach can be used to effectively demodulate MSK signals, other NRZ signals, or other signals that require knowledge of previous symbols in order to demodulate subsequent symbols. Note that "NRZ signal" in this document refers to any signal having a non-return to zero form or a derivative or variant thereof, such as a non-return to zero inverted signal. Also, this AI/ML-based approach can be used to correctly interpret the time-history relationship between symbols of an incoming signal without having previous knowledge of that relationship, such as when the architecture is not provided a sampling rate or time stamps for the incoming signal. Further, this AI/ML-based approach can be used to demodulate an incoming signal without previous knowledge of the starting phase or the starting transition value of the incoming signal. Moreover, this AI/ML-based approach can be used to robustly recover data bits at a high-performance level (such as at a bit error rate of less than $10^{-5}$) at a reasonable range of signal-to-noise ratio (SNR) values. In addition, while cognitive demodulators typically create a symbol mapping between one I/Q pair and one symbol output, this AI/ML-based approach can be used to successfully learn relationships between previous symbols and a current symbol in order to appropriately establish a mapping to output bit values.

Note that while this AI/ML-based approach is often described as being used with certain types of signals (such as MSK, Gaussian MSK or "GMSK", or NRZ-based signals), the same or similar approach may be used with various types of signals where knowledge of prior symbols is used to determine subsequent symbols. Also note that while this AI/ML-based approach is often described as being used for signal intelligence purposes, the AI/ML-based approach may be used for any other suitable purposes. For example, the AI/ML-based approach may be used to support cognitive radio communications. In general, the AI/ML-based approach described in this patent document may be used in any suitable device or system to support the demodulation of any suitable signals.

In addition, this AI/ML-based approach may be used in any suitable applications. For example, the AI/ML-based approach may be used to support communications over various types of communication links, such as cellular communications, optical communications, satellite communications, or deep-space communications. Specific examples of ways in which the AI/ML-based approach can be used may include telemetry for airborne applications, automatic identification systems for maritime or aerial vehicles, and communications over UNIVERSAL SERIAL BUS or other communication buses. Note, however, that the AI/ML-based approach may be used in any other suitable manner.

FIG. 1 illustrates an example architecture 100 supporting demodulation of NRZ or other signals using a multiple-input AI/ML model according to this disclosure. As shown in FIG. 1, the architecture 100 receives and processes information defining or otherwise associated with one or more input signals 102. The one or more input signals 102 contain (among other things) a signal that encodes information such that subsequent symbols depend on prior symbols, such as MSK, GMSK, NRZ, or other signals. The information associated with the one or more input signals 102 may be obtained from any suitable source, such as a receiver. The information associated with the one or more input signals 102 may also have any suitable form.

In this example, the architecture 100 includes a pre-processing function 104, which may pre-process the one or more input signals 102 in any suitable manner prior to further processing. For example, the pre-processing function 104 may include a finite impulse response (FIR) filter or other filter to smooth or otherwise pre-process the received input signal(s) 102. Any other or additional operations may occur as part of the pre-processing function 104 prior to additional processing.

The pre-processed information associated with the one or more input signals 102 is provided to an I/Q sampling function 106, which generates I and Q samples representing the one or more input signals 102. For example, the I/Q sampling function 106 may mix the one or more input signals 102 with a clock signal to produce the I samples, and the I/Q sampling function 106 may mix the one or more input signals 102 with a delayed version of the clock signal to produce the Q samples. The delayed version of the clock signal used to produce the Q samples is generally 90° out-of-phase with respect to the clock signal used to produce the I samples. Each I sample is associated with a corresponding Q sample to produce an I/Q pair, and multiple I/Q pairs are generated using the input signal(s) 102. The I/Q sampling function 106 may use any suitable technique to generate I and Q samples of one or more input signals 102.

The I/Q pairs are provided to a multi-input AI/ML demodulation model 108, which processes the I/Q pairs to generate output symbol predictions 110. The output symbol predictions 110 represent estimates of the symbols contained in the input signal(s) 102. The multi-input AI/ML demodulation model 108 here represents a trained AI/ML model that has been trained to process a set of I/Q pairs to identify a symbol estimate, where the set of I/Q pairs includes a current I/Q pair for a symbol being demodulated and one or more I/Q pairs for one or more symbols that have already been demodulated. Thus, the multi-input AI/ML demodulation model 108 is trained to consider a time history of symbols when performing demodulation, meaning the multi-input AI/ML demodulation model 108 can use knowledge of one or more previously-demodulated symbols to generate a current symbol estimate.

The multi-input AI/ML demodulation model 108 includes or uses any suitable AI/ML model that has been trained to use multiple I/Q pairs to demodulate symbols in incoming signals. In some embodiments, for example, the multi-input AI/ML demodulation model 108 may include or use an AI/ML model implemented using a shallow artificial neural network (ANN) with multiple hidden layers, where the ANN receives and processes vectors or other sets of I/Q pairs. The hidden layers of the ANN may each have a size of 2(N+1), where N represents the number of I and Q inputs contained in an input set. In some cases, the output symbol predictions 110 of the multi-input AI/ML demodulation model 108 represent "one hot" vectors that identify the demodulated symbol estimates. For a GMSK signal or other binary signal, for instance, the output symbol predictions 110 of the multi-input AI/ML demodulation model 108 may be expressed as [1,0] and [0,1], which represent the two binary symbols in one hot vector form. Note, however, that the output symbol predictions 110 may have any other suitable form and use any other suitable representation of symbol predictions. The output symbol predictions 110 represent data recovered from the one or more input signals 102, and the recovered data may be provided to any suitable destination(s) for storage or use.

The multi-input AI/ML demodulation model 108 may be trained to perform these functions in any suitable manner. For example, training data for the multi-input AI/ML demodulation model 108 can be obtained, where the training data includes (i) one or more known signals and (ii) known symbols contained in the one or more known signals. This training data may be generated, captured, or otherwise obtained in any suitable manner. For instance, simulated signals may be generated using a software tool, such as the "GNU Radio" development toolkit. Various amounts of noise, such as additive white Gaussian noise (AWGN), can be added to the simulated signals in order to improve the robustness of the training process. Random locations within the simulated signals can be selected as the starting point for the training data in order to add a randomization to the starting phase and starting transition value of the training data. In other words, the training data may include random starting phases and random starting transition values so that the AI/ML model can successfully operate after being placed into operation, regardless of the starting phase and starting transition value of a signal provided to the AI/ML model.

The simulated signals are provided to an AI/ML model being trained, and parameters of the AI/ML model can be adjusted (such as via backpropagation) so that the AI/ML model learns to recognize the symbols contained in the simulated signals. Ideally, the AI/ML model is trained to use time histories of I/Q pairs in order to learn causal relationships between symbols so that their symbol values can be recovered. A loss value can be determined based on instances where the AI/ML model fails to recognize the symbols contained in the simulated signals, and another iteration of training can occur if the loss value is excessive or above a desired threshold. This can continue until the loss value is suitably low or until some other criterion or criteria are met (such as a specified number of training iterations occurring or a specific amount of time elapsing). The same process described above may be used with any suitable training data and is not limited to the use of simulated signals. In some cases, the multi-input AI/ML demodulation model 108 can be trained using a mean squared error (MSE) loss function, such as with the AdamW optimizer (which may have a learning rate of 0.00001 or other suitable value). Note that any other suitable types of AI/ML models may be used here as the multi-input AI/ML demodulation model 108. Once the multi-input AI/ML demodulation model 108 is suitably trained, the multi-input AI/ML demodulation model 108 can be used to process sets of I/Q pairs representing the one or more input signals 102 in order to identify symbols contained in the input signal(s) 102.

Note that the various functions 104-108 shown in FIG. 1 and described above may be implemented in any suitable manner. For example, in some embodiments, the functions 104-108 shown in FIG. 1 may be implemented or supported using one or more software applications or other software/firmware instructions that are executed by at least one processor or other processing device. In other embodiments, at least some of the functions 104-108 shown in FIG. 1 can be implemented or supported using dedicated hardware components. In general, the functions 104-108 shown in FIG. 1 and described above may be performed using any suitable hardware or any suitable combination of hardware and software/firmware instructions.

Although FIG. 1 illustrates one example of an architecture 100 supporting demodulation of NRZ or other signals using a multiple-input AI/ML model, various changes may be made to FIG. 1. For example, various components in FIG. 1 may be combined, further subdivided, replicated, omitted, or rearranged and additional components may be added according to particular needs. Also, the various functions shown in FIG. 1 and described above may be implemented using a single device or multiple devices that may or may not be geographically distributed.

Figure 2:
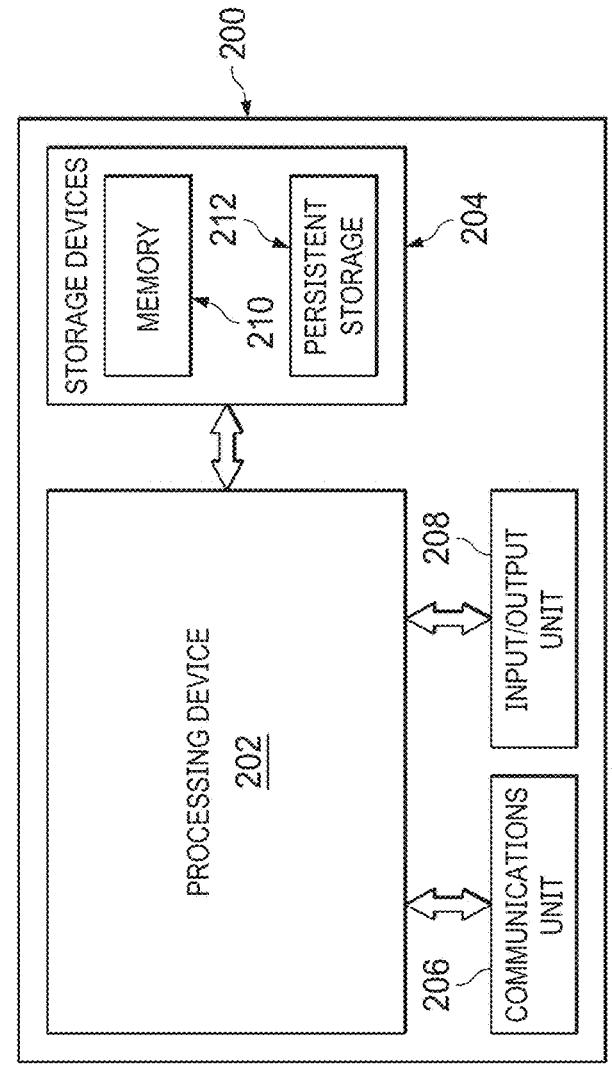
FIG. 2 illustrates an example device supporting demodulation of NRZ or other signals using a multiple-input AI/ML model according to this disclosure.

FIG. 2 illustrates an example device 200 supporting demodulation of NRZ or other signals using a multiple-input AI/ML model according to this disclosure. At least one instance of the device 200 may, for example, be used to implement at least a portion of the architecture 100 shown in FIG. 1 and described above. Note, however, that the architecture 100 may be implemented using any other suitable devices or systems. As a particular example, the architecture 100 may be implemented using multiple instances of the device 200, which may be positioned at or near the same general location or geographically distributed over a wide (and possibly very large) area.

As shown in FIG. 2, the device 200 may include at least one processing device 202, at least one storage device 204, at least one communications unit 206, and at least one input/output (I/O) unit 208. The processing device 202 may execute instructions that can be loaded into a memory 210. The processing device 202 includes any suitable number(s) and type(s) of processors or other processing devices in any suitable arrangement. Example types of processing devices 202 include one or more microprocessors, microcontrollers, digital signal processors (DSPs), application specific integrated circuits (ASICs), field programmable gate arrays (FPGAs), or discrete circuitry.

The memory 210 and a persistent storage 212 are examples of storage devices 204, which represent any structure(s) capable of storing and facilitating retrieval of information (such as data, program code, and/or other suitable information on a temporary or permanent basis). The memory 210 may represent a random access memory or any other suitable volatile or non-volatile storage device(s). The persistent storage 212 may contain one or more components or devices supporting longer-term storage of data, such as a read only memory, hard drive, Flash memory, or optical disc.

In some embodiments, one or more of the storage devices 204 may be used to store information associated with the one or more input signals 102 and/or information generated by one or more of the various functions 104-108 of the architecture 100.

The communications unit 206 supports communications with other systems or devices. For example, the communications unit 206 can include a network interface card or a wireless transceiver facilitating communications over a wired or wireless network. As particular examples, the communications unit 206 may be used to obtain information associated with one or more captured signals or other input signals 102 to be analyzed, or the communications unit 206 may be used to provide the output symbol predictions 110 or data represented by the output symbol predictions 110. The communications unit 206 may support communications through any suitable physical or wireless communication link(s).

The I/O unit 208 allows for input and output of data. For example, the I/O unit 208 may provide a connection for user input through a keyboard, mouse, keypad, touchscreen, or other suitable input device. The I/O unit 208 may also send output to a display or other suitable output device. Note, however, that the I/O unit 208 may be omitted if the device 200 does not require local I/O, such as when the device 200 represents a server or other device that can be accessed remotely.

In some embodiments, instructions are executed by the processing device 202 to implement the functionality of one or more functions shown in FIG. 1 and described above. For example, the instructions executed by the processing device 202 may cause the device 200 to obtain information associated with one or more input signals 102, generate I/Q pairs associated with the input signal(s) 102, and process the I/Q pairs using the multi-input AI/ML demodulation model 108 to identify symbol estimates.

Although FIG. 2 illustrates one example of a device 200 supporting demodulation of NRZ or other signals using a multiple-input AI/ML model, various changes may be made to FIG. 2. For example, computing and communication devices and systems come in a wide variety of configurations, and FIG. 2 does not limit this disclosure to any particular computing or communication device or system.

Figure 3:
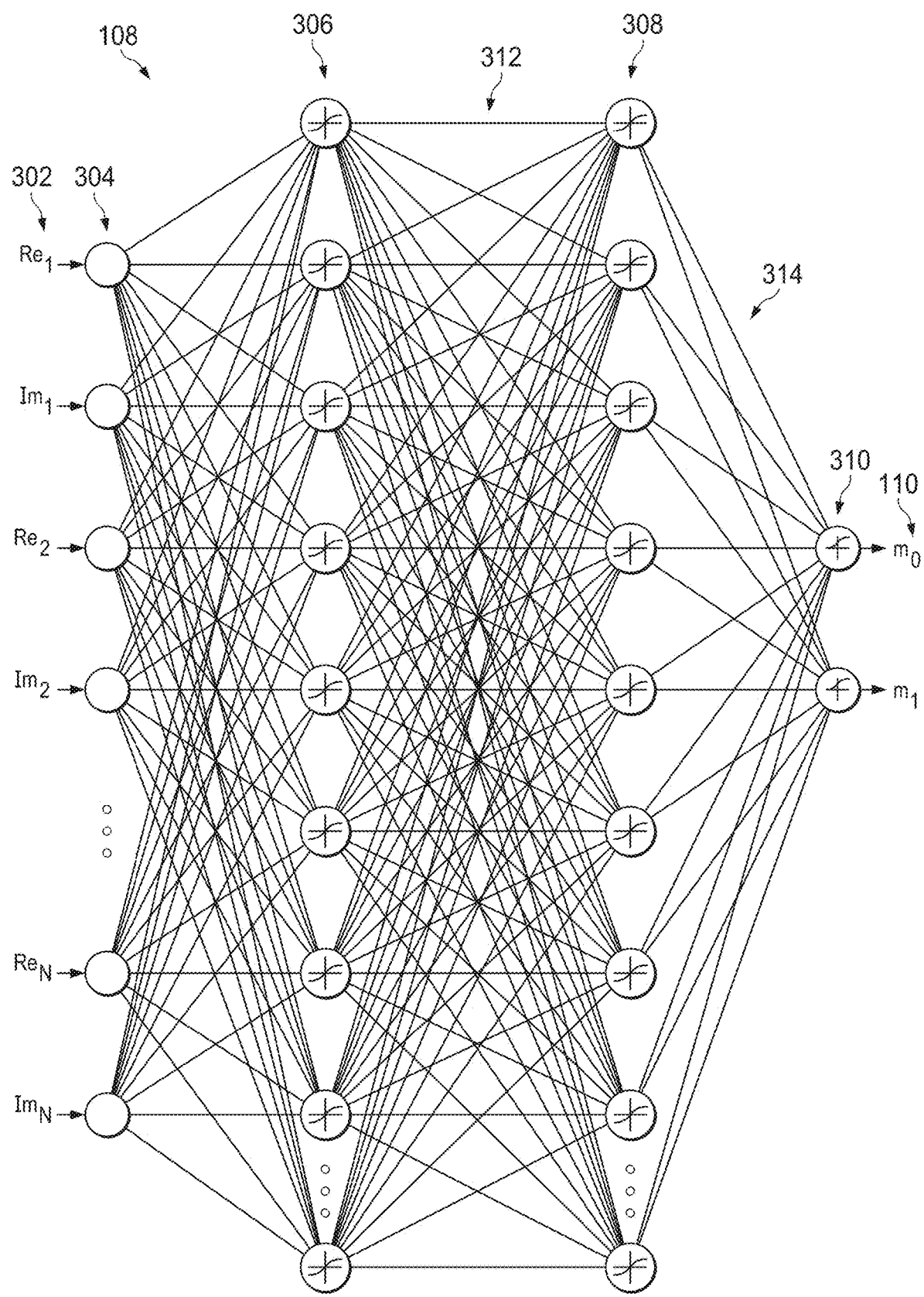
FIG. 3 illustrates an example multi-input AI/ML demodulation model for use in demodulating NRZ or other signals according to this disclosure.

FIG. 3 illustrates an example multi-input AI/ML demodulation model 108 for use in demodulating NRZ or other signals according to this disclosure. For ease of explanation, the multi-input AI/ML demodulation model 108 is described as being used in the architecture 100 of FIG. 1, which may be implemented using one or more devices 200 of FIG. 2. However, the multi-input AI/ML demodulation model 108 may be used by any other suitable device and in any other suitable system.

As shown in FIG. 3, the multi-input AI/ML demodulation model 108 is configured to receive a set 302 of inputs, where the set 302 includes multiple I/Q pairs. In this example, each I/Q pair is represented as an in-phase or real component $Re_x$ and a quadrature or imaginary component $Im_x$. Here, the set 302 includes a total of N different I and Q inputs, and the I and Q inputs are arranged sequentially in time. Thus, $Re_1$ and $Im_1$ collectively represent the oldest I/Q pair in the set 302, $Re_2$ and $Im_2$ collectively represent the second-oldest I/Q pair in the set 302, and $Re_N$ and $Im_N$ collectively represent the newest I/Q pair in the set 302.

The multi-input AI/ML demodulation model 108 includes an input layer 304, two hidden layers 306 and 308, and an output layer 310. The input layer 304 here receives the set 302 of inputs and provides the inputs to the first hidden layer 306. Each hidden layer 306 and 308 and the output layer 310 includes nodes representing artificial neurons, each of which is trained to receive input data and generate output data. Here, the first hidden layer 306 operates on the input data contained in the set 302 to produce results 312, and the second hidden layer 308 operates on the results 312 from the first hidden layer 306 to produce additional results 314. The output layer 310 operates using the additional results 314 to produce output symbol predictions 110, which in this example take the form of a one hot vector having the form $[m_0, m_1]$. As noted above, for binary symbols, the output symbol predictions 110 may be expressed as [1,0] and [0,1] to distinguish between the two binary symbols. Also, as noted above, the size of each hidden layer 306 and 308 may be expressed as 2(N+1), where N denotes the number of inputs into the network 302. Additionally, the output layer 310 can scale with the number/size of the symbols, such as when the output layer 310 supports two outputs for one-bit (binary) symbols, four outputs for two-bit symbols, and eight outputs for three-bit symbols.

In this example, the input layer 304 may operate to distribute all of the inputs contained in the set 302 to each node of the first hidden layer 306, so each node of the first hidden layer 306 may receive the complete set 302 of inputs. Also, each node of the first hidden layer 306 may provide its results 312 to every node of the second hidden layer 308, so each node of the second hidden layer 308 may receive results 312 from every node of the first hidden layer 306. In addition, each node of the second hidden layer 308 may provide its additional results 314 to every node of the output layer 310, so each node of the output layer 310 may receive additional results 314 from every node of the second hidden layer 308. Note, however, that other interconnections between nodes of the multi-input AI/ML demodulation model 108 may be supported depending on (among other things) the structure of the multi-input AI/ML demodulation model 108. Also, in this example, each node of the first hidden layer 306, the second hidden layer 308, and the output layer 310 may support the use of a hyperbolic tangent activation function, which is a function that defines the output of that node based on the inputs provided to that node. However, each node of various layers of the multi-input AI/ML demodulation model 108 may support any suitable activation function.

Although FIG. 3 illustrates one example of a multi-input AI/ML demodulation model 108 for use in demodulating NRZ or other signals, various changes may be made to FIG. 3. For example, the multi-input AI/ML demodulation model 108 may be implemented using any other AI/ML model that receives multiple I/Q pairs as inputs and generates output symbol predictions 110 as outputs. Also, while it is assumed in FIG. 3 that the value of N is at least six (three I and three Q inputs), N may have any other suitable integer value. Based on that, the size of each hidden layer 306 and 308 can vary depending on the implementation.

Figure 4:
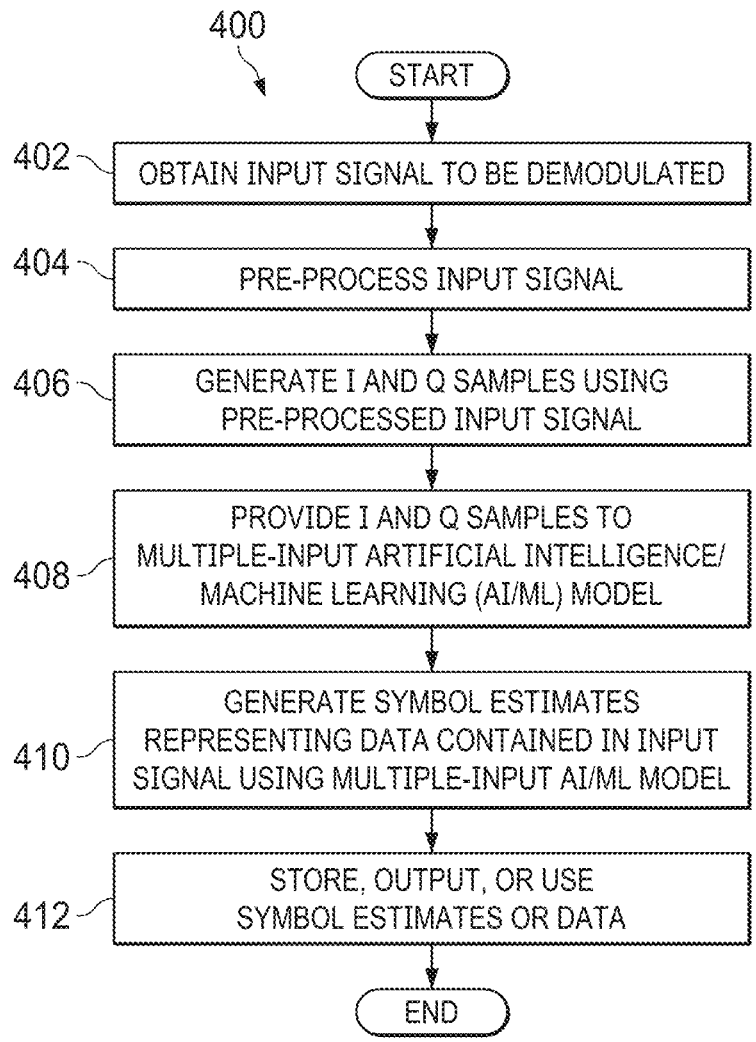
FIG. 4 illustrates an example method for demodulating NRZ or other signals using a multiple-input AI/ML model according to this disclosure.

FIG. 4 illustrates an example method 400 for demodulating NRZ or other signals using a multiple-input AI/ML model according to this disclosure. For ease of explanation, the method 400 is described as being performed using the architecture 100 of FIG. 1 and the device 200 of FIG. 2. However, the method 400 may be performed by any other suitable device and in any other suitable system.

As shown in FIG. 4, an input signal to be demodulated is obtained at step 402, and pre-processing of the input signal may be performed at step 404. This may include, for example, the processing device 202 receiving information defining one or more input signals 102, which may be obtained from any suitable source. This may also include the processing device 202 performing the pre-processing function 104 to filter or otherwise pre-process the information defining the one or more input signals 102. I and Q samples are generated using the pre-processed input signal at step 406. This may include, for example, the processing device 202 performing the I/Q sampling function 106 to generate I/Q pairs representing the input signal(s) 102. As a particular example, this may include the processing device 202 mixing the pre-processed input signal(s) 102 with a clock signal to generate the I samples and mixing the pre-processed input signal(s) 102 with a 90° delayed version of the clock signal to generate the Q samples.

The I/Q sample pairs are provided to a multiple-input AI/ML model at step 408, and symbol estimates representing data contained in the input signal are generated at step 410. This may include, for example, the processing device 202 providing a set 302 of I/Q pairs to the multi-input AI/ML demodulation model 108 and using the multi-input AI/ML demodulation model 108 to generate an output symbol prediction 110. This may also include the processing device 202 shifting the I/Q pairs in the set 302 to remove the oldest I/Q pair, adding a new I/Q pair to the set 302, and providing the updated set 302 to the multi-input AI/ML demodulation model 108 for use in generating another output symbol prediction 110. This process may be repeated any number of times to generate any number of output symbol predictions 110.

The symbol estimates or the data represented by the symbol estimates can be stored, output, or used in any suitable manner at step 412. This may include, for example, the processing device 202 providing the output symbol predictions 110 or the data represented by the output symbol predictions 110 to one or more external destinations for storage, analysis, or other use. Various applications that use the output symbol predictions 110 or the data represented by the output symbol predictions 110 are described above, such as cognitive radio communications, cellular communications, optical communications, satellite communications, deep-space communications, telemetry for airborne applications, automatic identification systems for maritime or aerial vehicles, or communications over communication buses. Note, however, that the output symbol predictions 110 or the data represented by the output symbol predictions 110 may be used in any other suitable manner.

Although FIG. 4 illustrates one example of a method 400 for demodulating NRZ or other signals using a multiple-input AI/ML model, various changes may be made to FIG. 4. For example, while shown as a series of steps, various steps in FIG. 4 may overlap, occur in parallel, occur in a different order, or occur any number of times.

The following describes example embodiments of this disclosure that implement the demodulation of NRZ or other signals using a multiple-input AI/ML model. However, other embodiments may be used in accordance with the teachings of this disclosure.

In a first embodiment, a method includes obtaining pairs of in-phase (I) and quadrature (Q) samples associated with a signal to be demodulated. The method also includes providing a set of the I/Q pairs to a trained AI/ML model. The set of the I/Q pairs includes an I/Q pair associated with a symbol being demodulated and at least one I/Q pair associated with at least one prior symbol that has been demodulated. In addition, the method includes using the trained AI/ML model to generate a symbol estimate for the symbol based on the set of the I/Q pairs, where the symbol estimate represents a portion of data that is encoded in the signal.

In a second embodiment, an apparatus includes at least one processing device configured to obtain pairs of I and Q samples associated with a signal to be demodulated. The at least one processing device is also configured to provide a set of the I/Q pairs to a trained AI/ML model. The set of the I/Q pairs includes an I/Q pair associated with a symbol being demodulated and at least one I/Q pair associated with at least one prior symbol that has been demodulated. The at least one processing device is further configured to use the trained AI/ML model to generate a symbol estimate for the symbol based on the set of the I/Q pairs, where the symbol estimate represents a portion of data that is encoded in the signal.

In a third embodiment, a non-transitory computer readable medium contains instructions that when executed cause at least one processor to obtain pairs of I and Q samples associated with a signal to be demodulated. The medium also contains instructions that when executed cause the at least one processor to provide a set of the I/Q pairs to a trained AI/ML model. The set of the I/Q pairs includes an I/Q pair associated with a symbol being demodulated and at least one I/Q pair associated with at least one prior symbol that has been demodulated. The medium further contains instructions that when executed cause the at least one processor to use the trained AI/ML model to generate a symbol estimate for the symbol based on the set of the I/Q pairs, where the symbol estimate represents a portion of data that is encoded in the signal.

Any single one or any suitable combination of the following features may be used with the first, second, or third embodiment. The I/Q pairs in the set of the I/Q pairs may be shifted to drop an oldest I/Q pair from the set, an additional I/Q pair associated with a second symbol being demodulated may be added to produce an updated set, the updated set may be provided to the trained AI/ML model, and the trained AI/ML model may be used to generate a second symbol estimate for the second symbol based on the updated set, where the second symbol estimate represents another portion of data that is encoded in the signal. The I/Q pairs in the set of the I/Q pairs may be arranged in time-based order. The trained AI/ML model may include an input layer configured to receive the set of the I/Q pairs, first and second hidden layers configured to process the set of the I/Q pairs, and an output layer configured to receive outputs from the second hidden layer and generate the symbol estimate for the symbol based on the outputs from the second hidden layer. The set of the I/Q pairs may include N I and Q samples, and the first and second hidden layers may each have a number of nodes representing artificial neurons equal to 2(N+1). The trained AI/ML model may be trained by obtaining training data including signals having known symbols, randomly selecting starting points in the training data, and providing the training data starting at the selected starting points to an AI/ML model in order to train the AI/ML model and produce the trained AI/ML model, where randomly selecting the starting points in the training data may allow random starting phases and random starting transition values to be included in the training data. The signal may include at least one of: an MSK signal, a GMSK signal, and an NRZ signal.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive (HDD), a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable storage device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present disclosure should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method comprising:
    obtaining pairs of in-phase (I) and quadrature (Q) samples associated with a signal to be demodulated;
    providing a set of the I/Q pairs to a trained artificial intelligence/machine learning (AI/ML) model, the set of the I/Q pairs including an I/Q pair associated with a symbol being demodulated and at least one I/Q pair associated with at least one prior symbol that has been demodulated; and
    using the trained AI/ML model to generate a symbol estimate for the symbol based on the set of the I/Q pairs, wherein the symbol estimate represents a portion of data that is encoded in the signal.

2. The method of claim 1, further comprising:
    shifting the I/Q pairs in the set of the I/Q pairs to drop an oldest I/Q pair from the set;
    adding an additional I/Q pair associated with a second symbol being demodulated to produce an updated set;
    providing the updated set to the trained AI/ML model; and
    using the trained AI/ML model to generate a second symbol estimate for the second symbol based on the updated set, wherein the second symbol estimate represents another portion of data that is encoded in the signal.

3. The method of claim 1, wherein the I/Q pairs in the set of the I/Q pairs are arranged in time-based order.

4. The method of claim 1, wherein the trained AI/ML model comprises:
    an input layer configured to receive the set of the I/Q pairs;
    first and second hidden layers configured to process the set of the I/Q pairs; and
    an output layer configured to receive outputs from the second hidden layer and generate the symbol estimate for the symbol based on the outputs from the second hidden layer.

5. The method of claim 4, wherein:
    the set of the I/Q pairs includes N I and Q samples; and
    the first and second hidden layers each have a number of nodes representing artificial neurons equal to 2(N+1).

6. The method of claim 1, wherein the trained AI/ML model is trained by:
    obtaining training data including signals having known symbols;
    randomly selecting starting points in the training data; and
    providing the training data starting at the selected starting points to an AI/ML model in order to train the AI/ML model and produce the trained AI/ML model; and
    wherein randomly selecting the starting points in the training data allows random starting phases and random starting transition values to be included in the training data.

7. The method of claim 1, wherein the signal comprises at least one of: a minimum shift keying (MSK) signal, a Gaussian minimum shift keying (GMSK) signal, and a non-return to zero (NRZ) signal.

8. An apparatus comprising:
    at least one processing device configured to:
        obtain pairs of in-phase (I) and quadrature (Q) samples associated with a signal to be demodulated;
        provide a set of the I/Q pairs to a trained artificial intelligence/machine learning (AI/ML) model, the set of the I/Q pairs including an I/Q pair associated with a symbol being demodulated and at least one I/Q pair associated with at least one prior symbol that has been demodulated; and
        use the trained AI/ML model to generate a symbol estimate for the symbol based on the set of the I/Q pairs, wherein the symbol estimate represents a portion of data that is encoded in the signal.

9. The apparatus of claim 8, wherein the at least one processing device is further configured to:

shift the I/Q pairs in the set of the I/Q pairs to drop an oldest I/Q pair from the set;

add an additional I/Q pair associated with a second symbol being demodulated to produce an updated set;

provide the updated set to the trained AI/ML model; and use the trained AI/ML model to generate a second symbol estimate for the second symbol based on the updated set, wherein the second symbol estimate represents another portion of data that is encoded in the signal.

10. The apparatus of claim 8, wherein the I/Q pairs in the set of the I/Q pairs are arranged in time-based order.

11. The apparatus of claim 8, wherein the trained AI/ML model comprises:

an input layer configured to receive the set of the I/Q pairs;

first and second hidden layers configured to process the set of the I/Q pairs; and an output layer configured to receive outputs from the second hidden layer and generate the symbol estimate for the symbol based on the outputs from the second hidden layer.

12. The apparatus of claim 11, wherein:

the set of the I/Q pairs includes N I and Q samples; and the first and second hidden layers each have a number of nodes representing artificial neurons equal to 2(N+1).

13. The apparatus of claim 8, wherein the trained AI/ML model is trained by:

obtaining training data including signals having known symbols;

randomly selecting starting points in the training data; and providing the training data starting at the selected starting points to an AI/ML model in order to train the AI/ML model and produce the trained AI/ML model; and wherein randomly selecting the starting points in the training data allows random starting phases and random starting transition values to be included in the training data.

14. The apparatus of claim 8, wherein the signal comprises at least one of: a minimum shift keying (MSK) signal, a Gaussian minimum shift keying (GMSK) signal, and a non-return to zero (NRZ) signal.

15. A non-transitory computer readable medium containing instructions that when executed cause at least one processor to:

obtain pairs of in-phase (I) and quadrature (Q) samples associated with a signal to be demodulated;

provide a set of the I/Q pairs to a trained artificial intelligence/machine learning (AI/ML) model, the set of the I/Q pairs including an I/Q pair associated with a symbol being demodulated and at least one I/Q pair associated with at least one prior symbol that has been demodulated; and use the trained AI/ML model to generate a symbol estimate for the symbol based on the set of the I/Q pairs, wherein the symbol estimate represents a portion of data that is encoded in the signal.

16. The non-transitory computer readable medium of claim 15, wherein the instructions when executed further cause the at least one processor to:

shift the I/Q pairs in the set of the I/Q pairs to drop an oldest I/Q pair from the set;

add an additional I/Q pair associated with a second symbol being demodulated to produce an updated set;

provide the updated set to the trained AI/ML model; and use the trained AI/ML model to generate a second symbol estimate for the second symbol based on the updated set, wherein the second symbol estimate represents another portion of data that is encoded in the signal.

17. The non-transitory computer readable medium of claim 15, wherein the I/Q pairs in the set of the I/Q pairs are arranged in time-based order.

18. The non-transitory computer readable medium of claim 15, wherein the trained AI/ML model comprises:

an input layer configured to receive the set of the I/Q pairs;

first and second hidden layers configured to process the set of the I/Q pairs; and an output layer configured to receive outputs from the second hidden layer and generate the symbol estimate for the symbol based on the outputs from the second hidden layer.

19. The non-transitory computer readable medium of claim 18, wherein:

the set of the I/Q pairs includes N I and Q samples; and the first and second hidden layers each have a number of nodes representing artificial neurons equal to 2(N+1).

20. The non-transitory computer readable medium of claim 15, wherein the trained AI/ML model is trained by:

obtaining training data including signals having known symbols;

randomly selecting starting points in the training data; and providing the training data starting at the selected starting points to an AI/ML model in order to train the AI/ML model and produce the trained AI/ML model; and wherein randomly selecting the starting points in the training data allows random starting phases and random starting transition values to be included in the training data.

* * * * *